(12) United States Patent
Clevenger et al.

(10) Patent No.: US 6,441,421 B1
(45) Date of Patent: Aug. 27, 2002

(54) HIGH DIELECTRIC CONSTANT MATERIALS FORMING COMPONENTS OF DRAM STORAGE CELLS

(75) Inventors: Lawrence A. Clevenger, LaGrangeville; Louis L. Hsu, Fishkill; Carl J. Radens, LaGrangeville; Joseph F. Shepard, Jr., Fishkill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/858,485

(22) Filed: May 17, 2001

(51) Int. Cl.⁷ .............................. H01L 27/108
(52) U.S. Cl. ...................... 257/296; 257/300
(58) Field of Search ................... 257/296, 300

(56) References Cited

U.S. PATENT DOCUMENTS 5,357,464 A * 10/1994 Shukuri et al. .............. 365/185
5,434,438 A * 7/1995 Kuo ............................ 257/300
5,977,578 A * 11/1999 Tang ........................... 257/296
6,075,265 A * 6/2000 Goebel et al. ............... 257/296

* cited by examiner

Primary Examiner—David Nelms
Assistant Examiner—Tu-Tu Ho
(74) Attorney, Agent, or Firm—McGinn & Gibb, PLLC; Marian Underweiser, Esq.

(57) ABSTRACT

A method and structure for simultaneously producing a dynamic random access memory device and associated transistor is disclosed. The method forms channel regions and capacitor openings in a substrate. Next, the invention deposits capacitor conductors in the capacitor openings. Then, the invention simultaneously forms a single insulator layer above the channel region and above the capacitor conductor. This single insulator layer comprises a capacitor node dielectric above the capacitor conductor and comprises a gate dielectric above the channel region.

22 Claims, 9 Drawing Sheets

HIGH DIELECTRIC CONSTANT MATERIALS FORMING COMPONENTS OF DRAM STORAGE CELLS

BACKGROUND OF THE INVENTION

1. Field of the Invention

The present invention generally relates to integrated storage devices and more particularly to an improved dynamic random access memory dielectric structure.

2. Description of the Related Art

Dynamic random access memory (DRAM), is known to have a much higher memory density than static random access memory (SRAM) for the same chip area. To achieve high DRAM integration, either deep trench-capacitor or high-k dielectric stack-capacitor cells are commonly used. The deep trench capacitor has a planar surface topography, although the depth of the trench has become the limiting factor to prevent the scaling of DRAM exceeding 4Gb. Further, the high-k dielectric used in DRAMs is limited (mostly) by the material stability as well as the topography. The stack-capacitor is built on top of the silicon surface. The resulting non-planar surface has created problems for metallization as well as lithographic patterning. On the other hand, the performance of the DRAM that is determined by the drivability of MOS device is also now limited by the scaling.

As the channel width and oxide thickness of the devices cannot be reduced, the device performance begins to degrade. This becomes worse, when the Vdd (the power supply) level is also reduced. It is important that device performance must be maintained, so that DRAM access time, or cycle time can meet performance targets at low-power conditions. Fabrication steps to form trench or stack capacitor cell must be simple and have low-costs. Eventually, if DRAM cost cannot be reduced, the system of using large-volume DRAM will become expensive. In order for DRAM to completely replace the SRAM, not only does the density/area need to be improved, also the cost, power, and performance must all be attractive and competitive. Therefore, there is a need to reduce the cost and improve performance of DRAM.

SUMMARY OF THE INVENTION

In view of the foregoing and other problems, disadvantages, and drawbacks of the conventional DRAM structures, the present invention has been devised, and it is an object of the present invention to provide a structure and method for an improved DRAM structure.

In order to attain the object(s) suggested above, the invention includes a method for simultaneously producing a dynamic random access memory device and associated transistor. More specifically, the method forms channel regions and capacitor openings in a substrate. Next, the invention forms capacitor conductors in the capacitor openings. Then, the invention simultaneously forms a single insulator layer above the channel regions and above the capacitor conductors. This single insulator layer comprises a capacitor node dielectric above the capacitor conductor and comprises a gate dielectric above the channel region.

In addition, the invention simultaneously patterns a single conductor layer above the single insulator layer. The single conductor layer forms a gate conductor above the gate dielectric and a ground plate above the capacitor node dielectric. In additional processing steps, the invention forms spacers on the gate conductor and the ground plate, dopes portions of the channel region to form source and drain regions (the drain region is in contact with the capacitor conductor), forms a covering insulator above the single conductor layer, and forms conductive contacts through the covering insulator to the source region.

The insulating substrate preferably includes shallow trench isolation regions below the capacitor conductors and the channel region preferably starts as a pure silicon region within the substrate. In addition, the single insulator layer preferably comprises an atomic level chemical vapor deposition process having molar ratios consistent with glass.

The invention also comprises a dynamic random access memory device that includes channel regions and capacitor conductors in a substrate. A single insulator layer is positioned above the channel regions and above the capacitor conductors. The single insulator layer comprises a capacitor node dielectric above the capacitor conductor and comprises a gate dielectric above the channel region. In addition, the invention includes a single conductor layer above the single insulator layer. The single conductor layer comprises a gate conductor above the gate dielectric and a ground plate above the capacitor node dielectric.

Further, there are spacers on the gate conductor and the ground plate, source and drain regions within the substrate (the source region is positioned on an opposite side of the gate conductor from the drain region). A covering insulator is positioned above the single conductor layer and conductive contacts extend through the covering insulator to the source region. The single insulator layer has molar ratios consistent with glass and maintains an amorphous state up to 1000° C.

Thus, the invention forms high-k dielectrics in a single processing step for the transistor gate as well as the cell capacitor devices. This reduces the process cost, and also reduces the thermal budget seen while annealing the dielectric. The high-k dielectric used with the invention not only improves the transistor device performance, but also boosts the charge storage capability of the DRAM cells.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, there is a need to reduce the cost and improve performance of DRAM. The invention addresses these needs by providing a high-k material for both device gate dielectrics as well as capacitor dielectrics in a DRAM device. In a preferred embodiment, the invention uses a high-k film made using atomic level chemical vapor deposition (ALCVD) techniques. Using ALCVD to deposit a combination of $La_2O_3/Al_2O_3$ obtains a dielectric constant between 10 and 30 depending on the ratio of Al to La. The invention uses deposition conditions that retain the amorphous nature of the film stack in order to prevent electrical leakage. Details of the material characteristic and associated process steps to form such material is reported by Albert Chin, et al, in 2000 Symposium of VLSI Technology Digest of Technical Papers, pp 16–17, titled "High Quality La2O3 and Al2O3 Gate Dielectrics with Equivalent Oxide Thickness 5–10 Å".

The invention forms high-k dielectrics in a single process step for the MOS gate as well as the cell capacitor devices. This reduces the process cost, and also reduces the thermal budget seen while annealing the dielectric. The high-k dielectric used with the invention will not only improve the MOS device performance, but will also boost the charge storage capability of the DRAM cells.

An important feature of the invention is that the high-k dielectric provides a thinner equivalent dielectric for both the gate and the capacitor. Thus, the device drivability can be significantly improved. While various examples are used herein, the invention is not restricted to any particular high-k dielectric. Any stable high-k dielectric material can be used. Further, with the invention, the final array structure is planar and provides sufficient space for sealing into subsequently formed layers of the integrated circuit structure.

One example of a fabrication process that produces a low-cost and high-performance (eDRAM) is shown in FIGS. 1–14. Although a SOI wafer is used for demonstration, the same (e)DRAM can also be built on a bulk substrate with proper well isolation.

Figure 1:
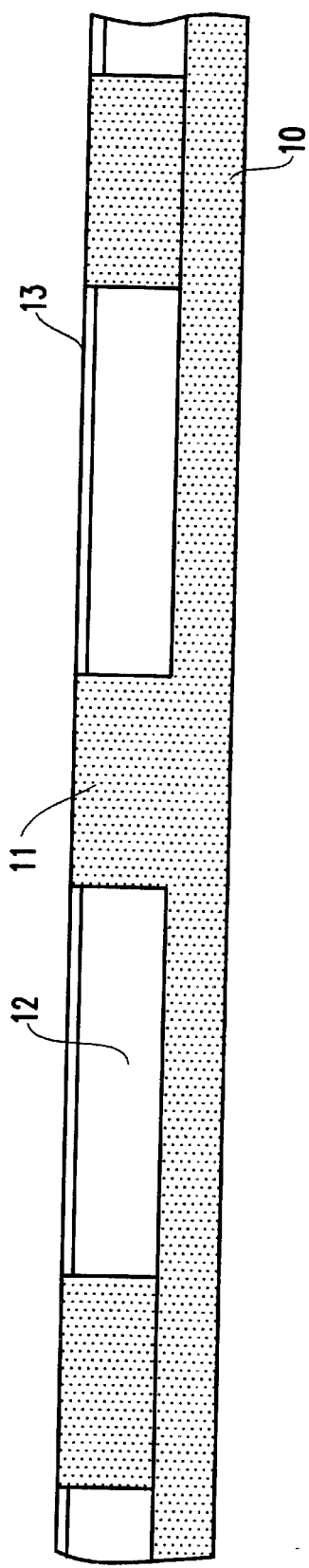
FIG. 1 is a schematic diagram of a partially completed DRAM structure according to the invention.
Figure 2:
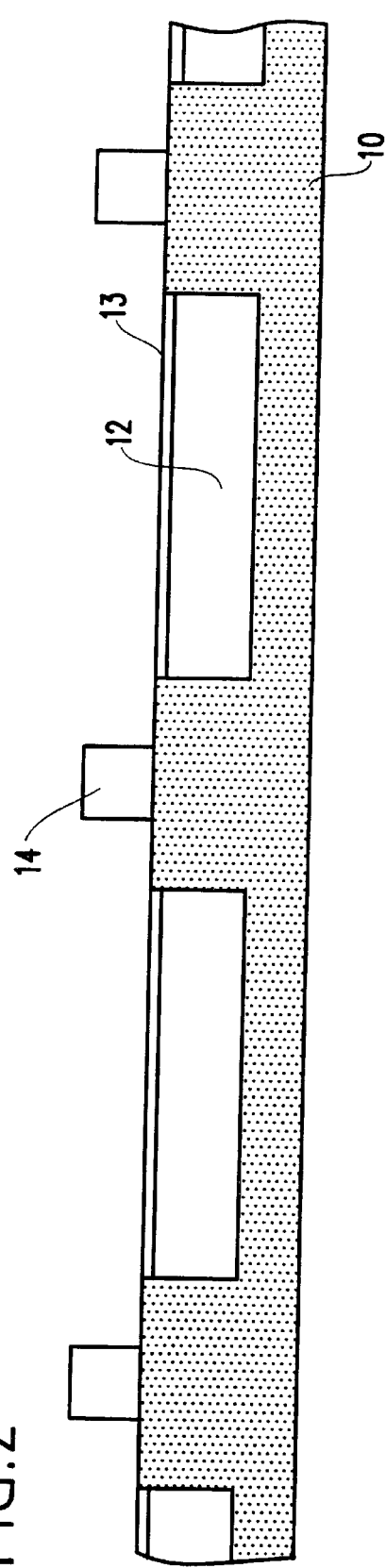
FIG. 2 is a schematic diagram of a partially completed DRAM structure according to the invention.
Figure 3:
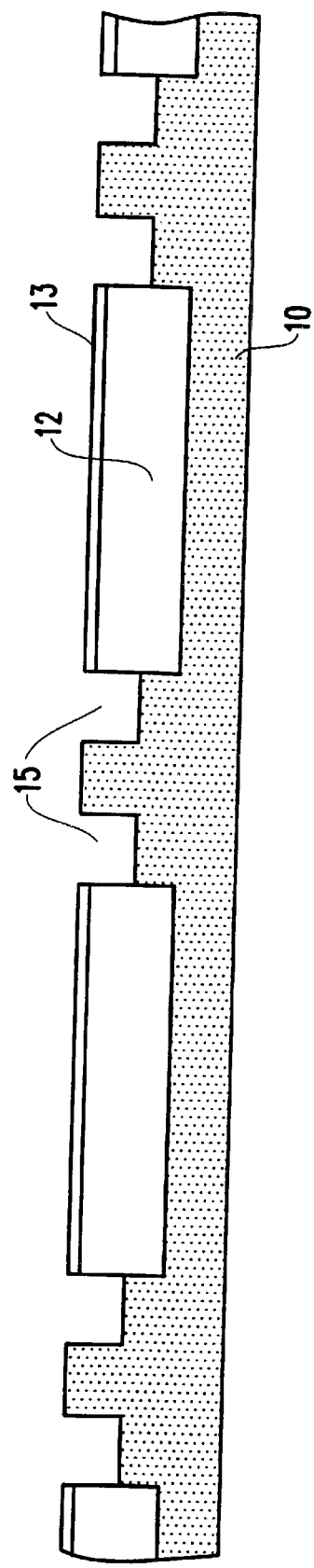
FIG. 3 is a schematic diagram of a partially completed DRAM structure according to the invention.

In FIG. 1, shallow trench isolations (or STI) 11 are formed on a SOI wafer with a buried oxide layer 10 and silicon layer 12 (e.g., well region.) A thin nitride layer 13 is deposited and used for chemical-mechanical polish (CMP) process. Also, the silicon layer substrate is properly implanted for Vth adjustment and isolation (not shown). In FIG. 2, a resist 14 is patterned to define the cell capacitor areas. Next, using the patterned resist 14, the invention performs a selective RIE (e.g. oxide to nitride etch rate ratio 100:1) oxide etching to form cavities 15, as shown in FIG. 3. The cavity areas 15 will form cell capacitors.

Figure 4:
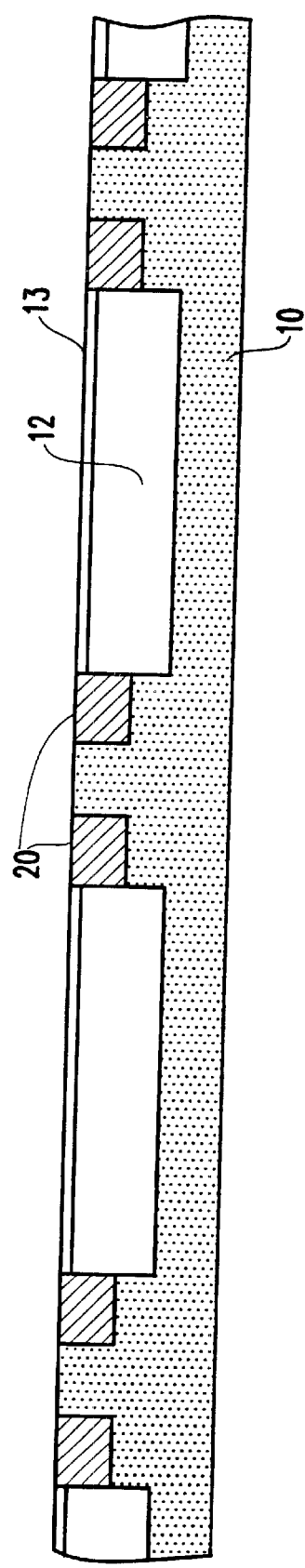
FIG. 4 is a schematic diagram of a partially completed DRAM structure according to the invention.
Figure 5:
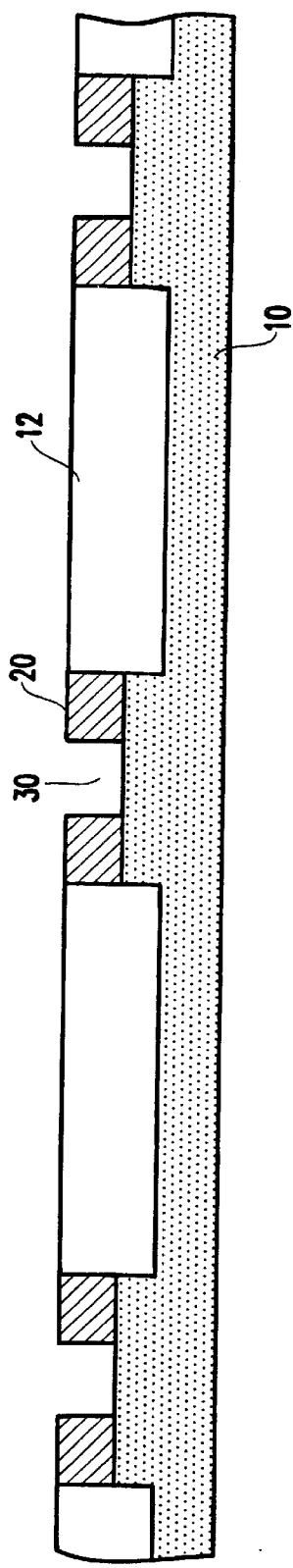
FIG. 5 is a schematic diagram of a partially completed DRAM structure according to the invention.
Figure 6:
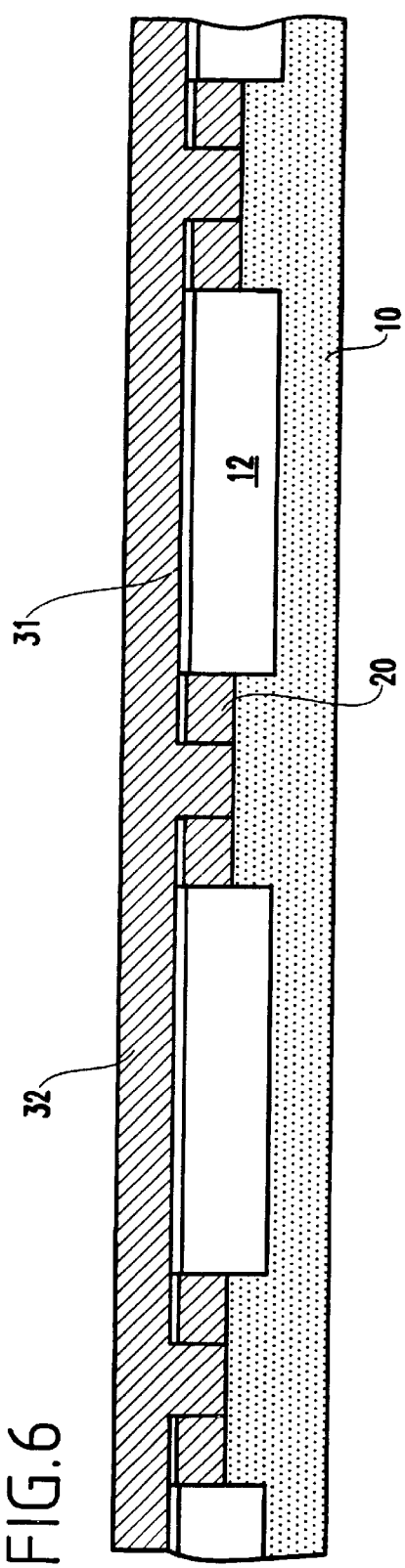
FIG. 6 is a schematic diagram of a partially completed DRAM structure according to the invention.

In FIG. 4, a layer of doped polysilicon 20 is deposited and polished back to fill the cavities 15. Then in FIG. 5, a selective RIE (e.g. oxide/nitride to polysilicon etch rate ratio 30:1) oxide etch is performed to recess the exposed oxide 30 in the STI regions 11. This is preferably a timed etch. After this etching, the top nitride layer 13 is also removed. Then, the silicon surface 12 is cleaned in, for example, a BHF (buffered HF) solution. Next, as shown in FIG. 6, a high-k dielectric layer 31 and a CVD polysilicon layer 32 are subsequently deposited. The structure is then annealed to stabilize the dielectric characteristic. The annealing can be for example, a rapid thermal anneal in O2/N2 ambient from 600 to 1000° C.

In order to maintain the elevated dielectric constant of the material and keep the electrical leakage to a minimum, the invention uses a process to form glass films (i.e. amorphous films) which maintain their non-crystalline structure at the elevated temperatures required in the fabrication of integrated circuit devices, such as deep trench capacitors.

This invention raises the dielectric constant of the node dielectric via the utilization of mixtures of high-k oxides in molar ratios consistent with the formation of glass films. Such films are intended to remain amorphous at elevated temperatures and thus maintain low electrical leakage via the elimination of grain boundaries. For example, in the bulk, $La_2O_3$ and $Al_2O_3$ can be mixed in a ratio of $40La_2O_3+60Al_2O_3$ to form a transparent glass with a critical cooling rate of less than 100 K/s. Thus, when deposited from the vapor phase, the cooling rate achieved with the inventive dielectric should be well in excess of the 100 K/s required to keep the glass vitreous (e.g., non-crystalline).

Furthermore, because the dielectric is amorphous a linear mixing law applies, which allows the dielectric constant of the resulting glass to be as great as 20 (the dielectric constants of $La_2O_3$ and $Al_2O_3$ are approximately 30 and 10, respectively) and thus more than a factor of 4 better than oxidized silicon nitride (which has a dielectric constant of approximately 4). Although, the fabrication of a two component glass is preferable from an ease of processing standpoint, it should be noted that the addition of a third or fourth oxide (e.g. $SiO_2$) is possible with the invention and could in fact be beneficial.

Mixing of oxides have been suggested for the fabrication of conventional gate oxides. In such cases, mixed oxides are formed as binary alloys consisting of dilute quantities of some high-k (e.g. $ZrO_2$) with the balance made up of $SiO_2$ (generically referred to as "silicates"). In contrast, the glass films of the invention do not have to adhere to the stingent interfacial requirements of a CMOS device and as such they can employ oxides other than $SiO_2$. Such compositions lend themselves to enhanced dielectric characteristics applicable to DRAM storage devices.

As mentioned above, the implementation of a high-k material is desirable in integrated circuit technology, such as trench capacitor technology. Although there are numerous conventional materials from which to choose, most (e.g. $ZrO_2$, $HfO_2$) crystallize at temperatures below 1000° C. Because capacitor construction is a front end process, most high-k films will therefore devitrify (i.e., loose their amorphous structure and crystalize) and be susceptible to excessive electrical leakage and premature failure. It is important therefore to design a material with an appropriate dielectric constant which remains amorphous at temperatures up to (and in excess) of 1000° C. To that end, an atomic layer chemical vapor deposition (ALCVD) process is described here in which glass forming combinations of $La_2O_3$ and $Al_2O_3$ are deposited for use as a high-k dielectric in trench capacitor technologies.

Thus, in a preferred embodiment, the invention uses a high-k film made using atomic level chemical vapor deposition (ALCVD) techniques. Using ALCVD to deposit a combination of $La_2O_3/Al_2O_3$ obtains a dielectric constant between 10 and 30 depending on the ratio of Al to La. The invention uses deposition conditions that retain the amorphous nature of the film stack in order to prevent electrical leakage.

Figure 7:
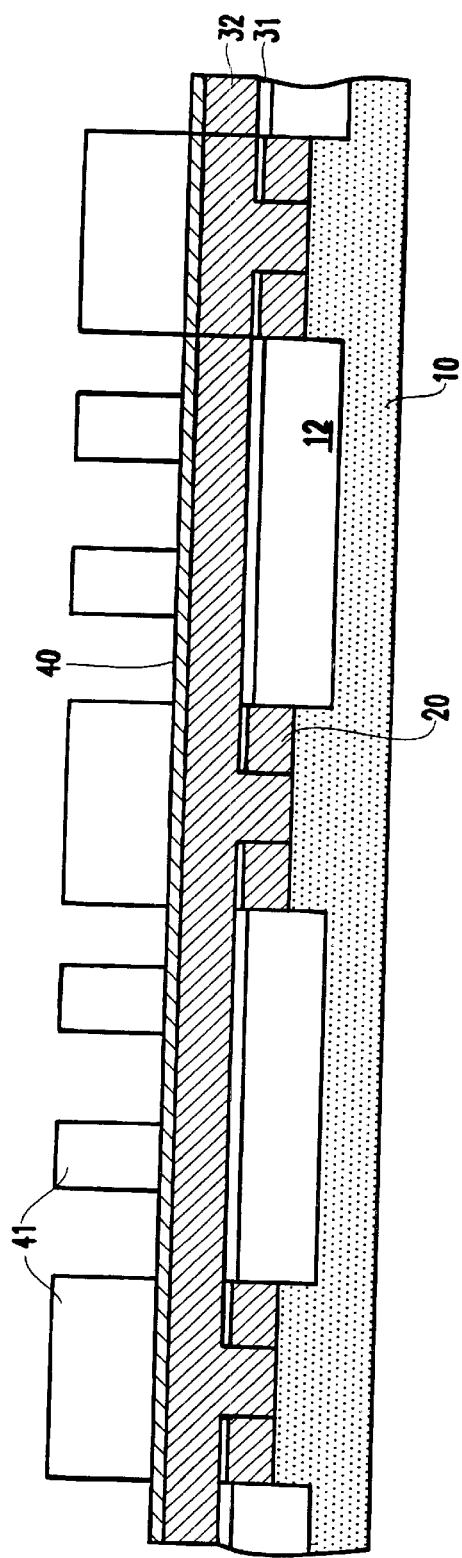
FIG. 7 is a schematic diagram of a partially completed DRAM structure according to the invention.
Figure 8:
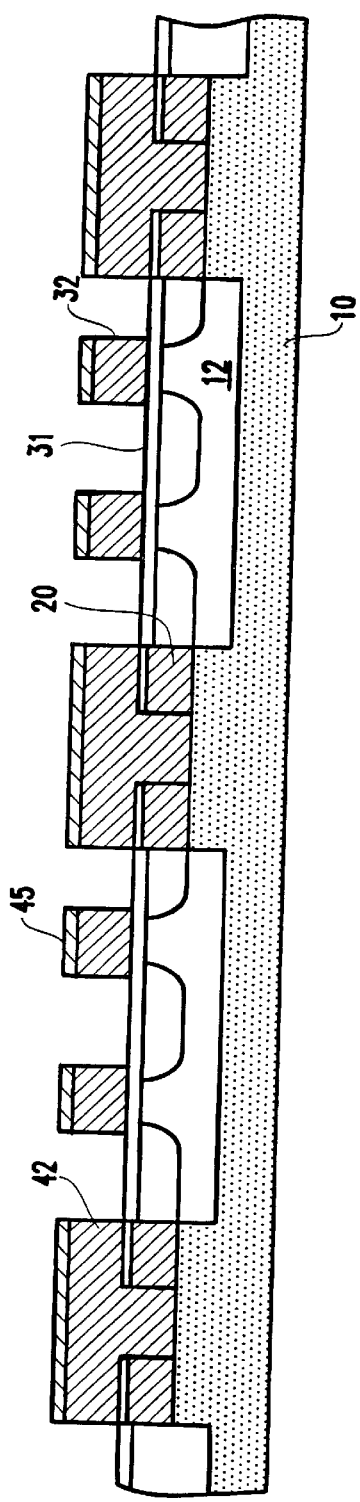
FIG. 8 is a schematic diagram of a partially completed DRAM structure according to the invention.
Figure 9:
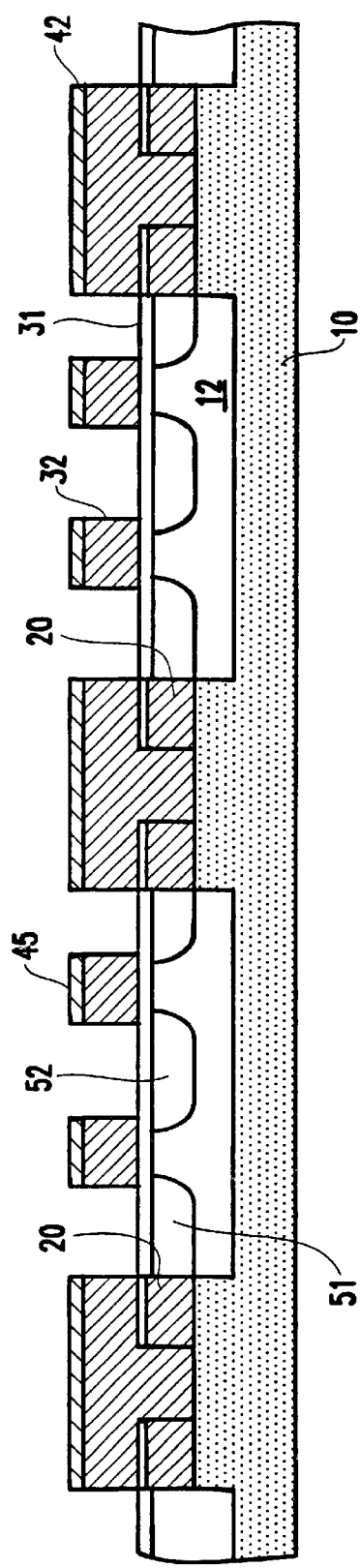
FIG. 9 is a schematic diagram of a partially completed DRAM structure according to the invention.

Referring now to FIG. 7, the invention forms a silicide or refractory metal 40 on top of the CVD poly 32. The silicide 40 is also capped with a layer of nitride (not shown) for borderless contact application. A patterned resist 41 is also formed and, RIE is carried to simultaneously define the ground plates 42 of the capacitors as well as the gates 45 of the transistors from the conductor 32, 40. If desired, this RIE process can also be extended to remove the exposed portions of the high-k layer 31. Next, as shown in FIG. 8, the resist 41 is removed and, as shown in FIG. 9, source 52 and drain 51 regions are formed by implanting an impurity and annealing the structure. The drain side 51 will also receive, during the annealing, dopant out-diffusion from the doped polysilicon 20 from the node plate of each capacitor.

Figure 10:
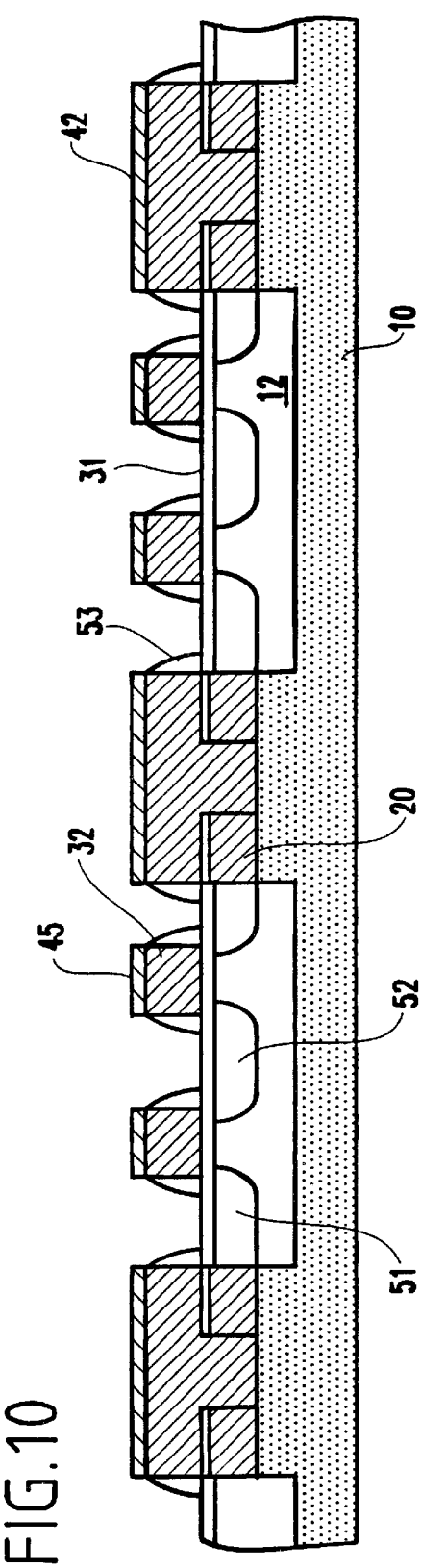
FIG. 10 is a schematic diagram of a partially completed DRAM structure according to the invention.
Figure 11:
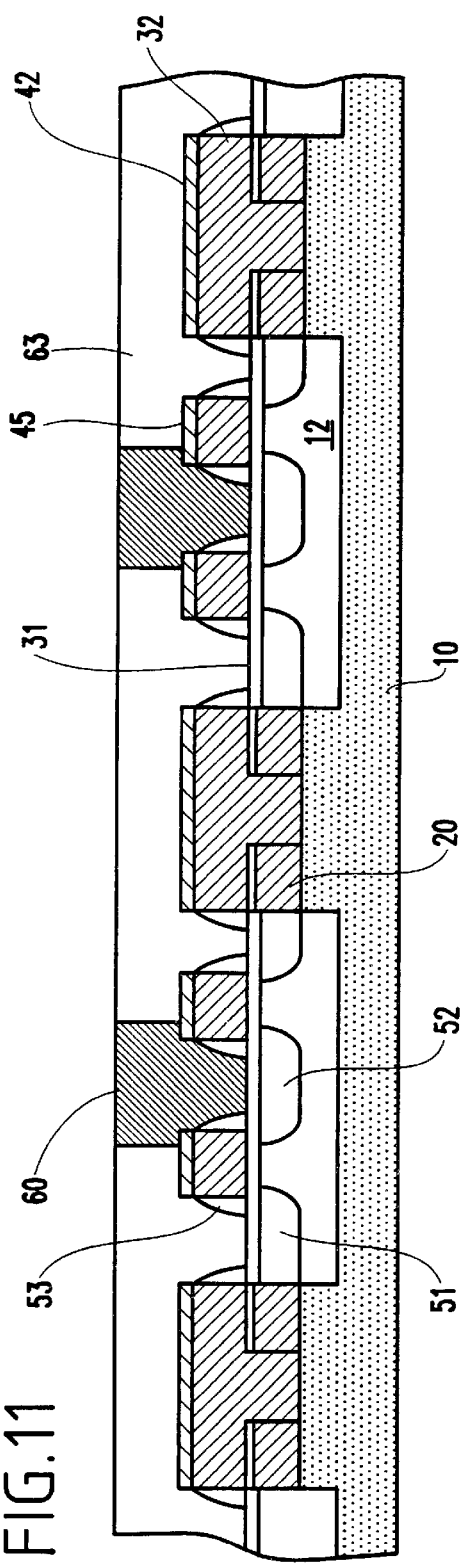
FIG. 11 is a schematic diagram of a partially completed DRAM structure according to the invention.
Figure 12:
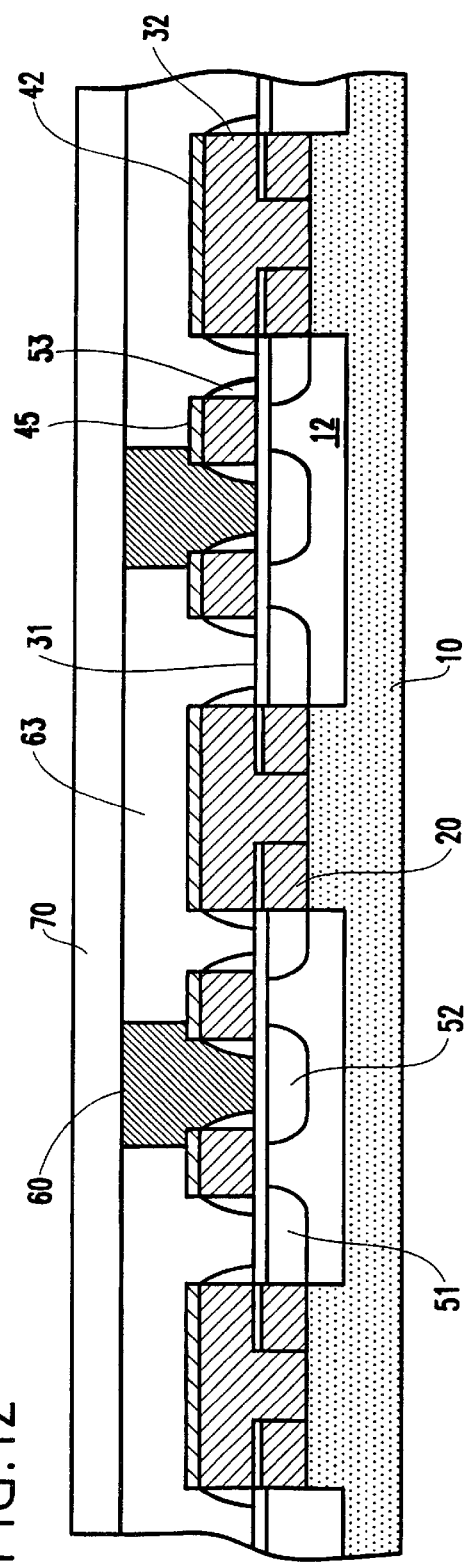
FIG. 12 is a schematic diagram of a partially completed DRAM structure according to the invention.

In FIG. 10, a conventional sidewall formation process is performed to form sidewall spacers 53, and if necessary, a lightly doped drain (LDD) implant made at this time to avoid hot-carrier problems. Next, as shown in FIG. 11, an isolation layer 63 is formed and contacts 60 to the common source 52 of the transistor devices are formed. The contacts 60 can be, for example, tungsten studs with a proper liner material. Then, in FIG. 12, the invention deposits and patterns layer of conductive material 70 that could be, for example, aluminum, copper, or a refractory metal. This conductive material 70 is used for bit-lines.

Figures 13A, 13B:
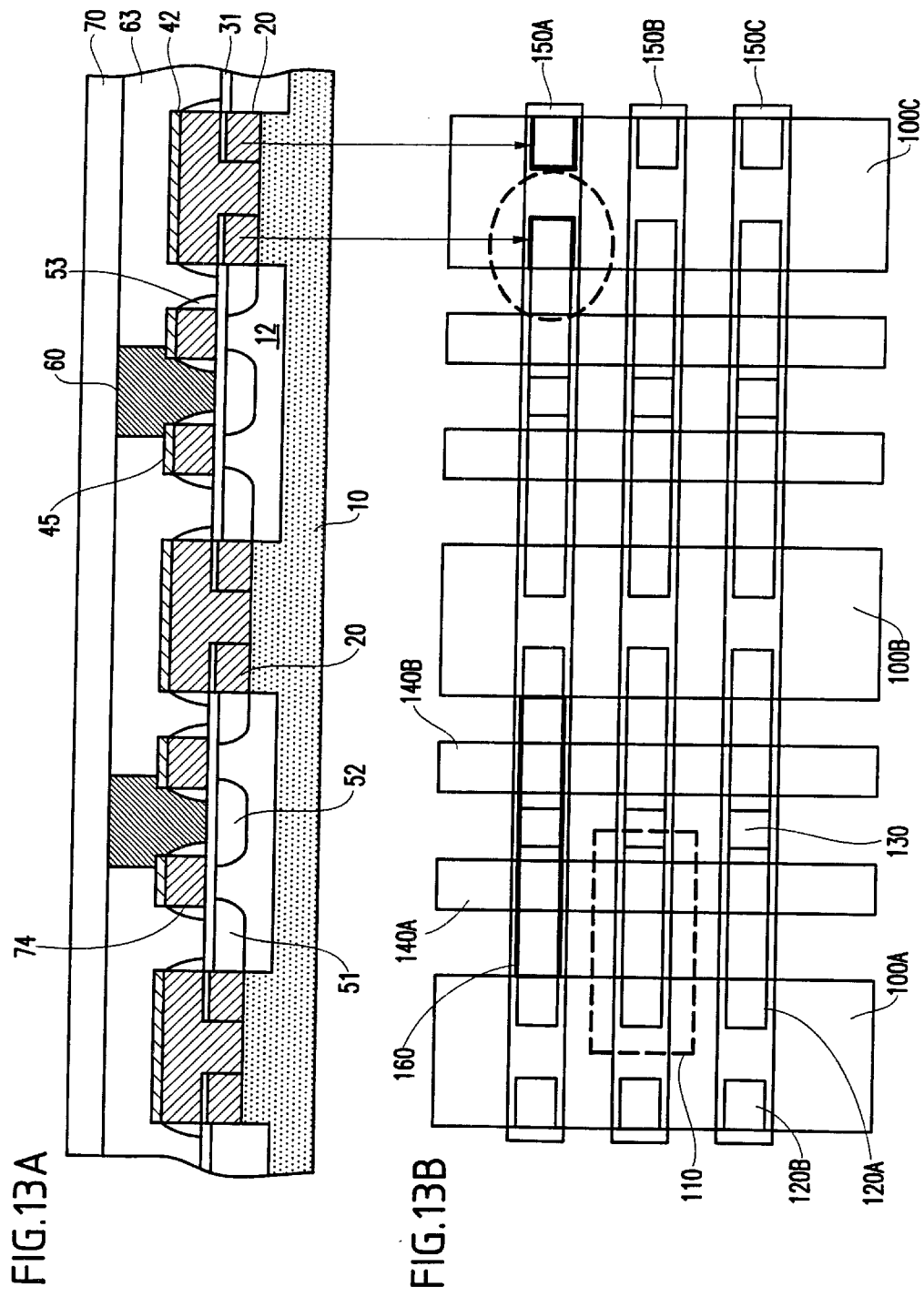
FIGS. 13A and 13B are a schematic diagram showing two views of a completed DRAM structure according to the invention.

The completed structure is shown in FIGS. 13A and 13B in both cross-section and top views. The storage capacitors are made up of the portion of the conductive polysilicon 20 in FIG. 13A, between insulators 10 (or 11) and 31. The field effect transistors (FET) that allow access to the storage capacitors are made up of the gate portion of the conductive polysilicon 32, labeled item 74 in FIG. 13A, the common source 52, and the drain 51.

FIG. 13B is the corresponding top-view of the inventive DRAM array circuit layout. 20 FIG. 13B illustrates three bitlines 150A, B and C that are formed in the horizontal direction, and four wordlines where two are labeled 140A and 140B that are formed in the vertical direction. The ground plates 42 for the capacitors are labeled 100A, B and C in FIG. 13B. The capacitors for each cell are shown in the boxes 120A and B. The solid rectangular shape 160 is the active area where devices are formed. Outside the active areas is the shallow trench isolation region. The dotted rectangular shape 110 is the unit cell size. In this example, the unit cell is an 8F square cell. The cell size can be easily reduced to 6F square and smaller by using sub-lithographic techniques.

Figure 14:
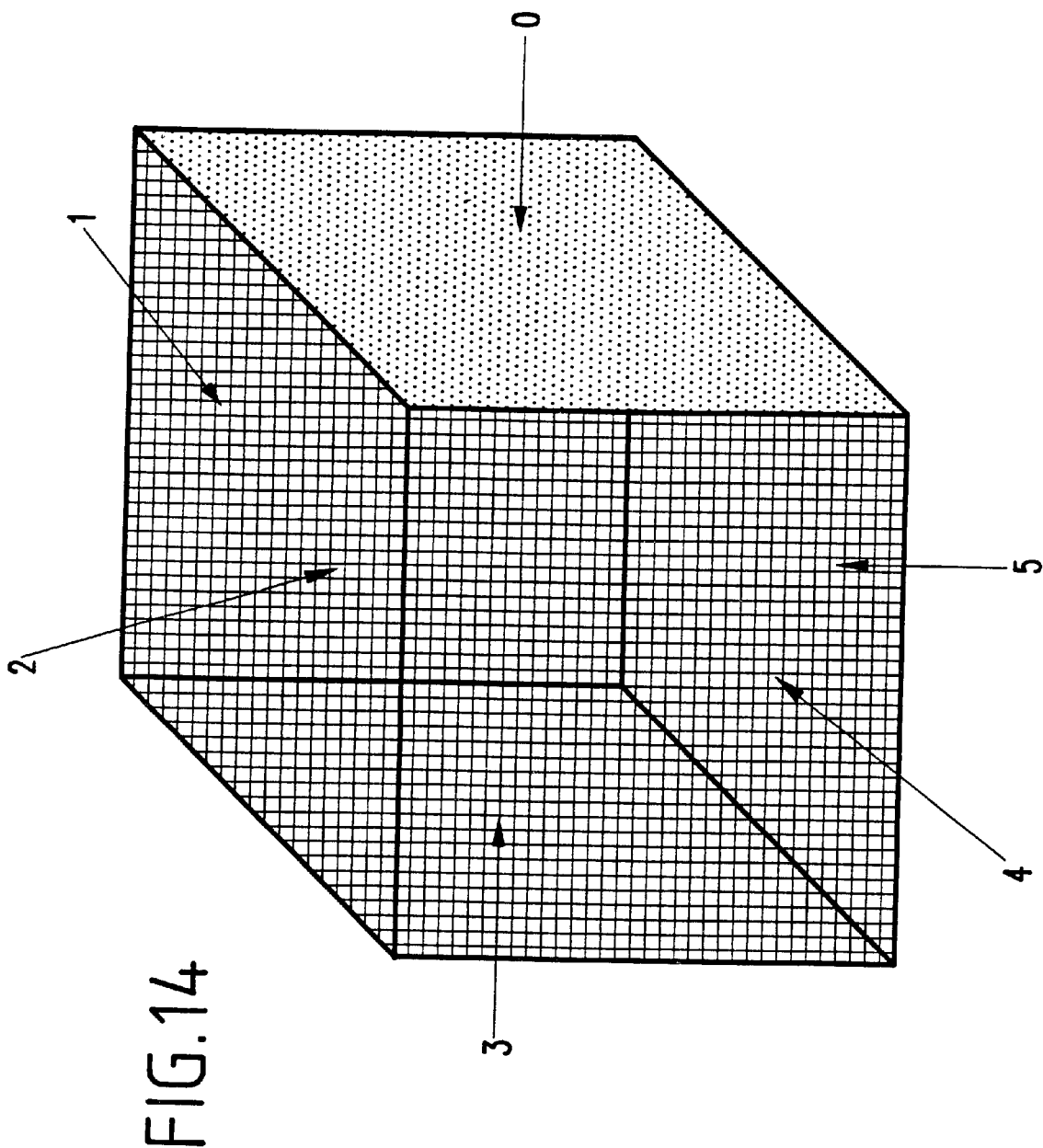
FIG. 14 is a schematic diagram of a crystalline structure according to the invention.

In FIG. 13B, the dotted circle area indicates how each cell is surrounded by the ground plate 100C. A more detailed diagram of the cell is shown in FIG. 14. For each capacitor, 4 sides (1,2,3 and 4) are surrounded by the ground plate, one side (0) is exposed to the drain contact, and the other side (5) is exposed to the STI 11 or substrate 10. Insulator 31 (the high-k X dielectric) covers sides 1,2,3,4 in between the ground plate and the polysilicon cube.

Therefore, as shown in FIG. 14, the effective surface area of the capacitor is greatly improved with the invention. Further, the height of the cubic shape can be easily controlled as it depends on the first dielectric etching of the shallow trench. The conventional stack capacitor may touch the ground plate in many sides, (e.g., may be five sides). However, since conventional capacitors are formed on top of the device this creates a topography problem. To the contrary, with the invention the capacitor is buried, at least at the same level of the gate, and the resulting surface is very planar. To increase the surface contact area and thus the capacitor size, as shown in FIG. 3, the cavity can be etched very deeply, so long as the etch does not penetrate through the buried oixde layer 10.

Figure 15:
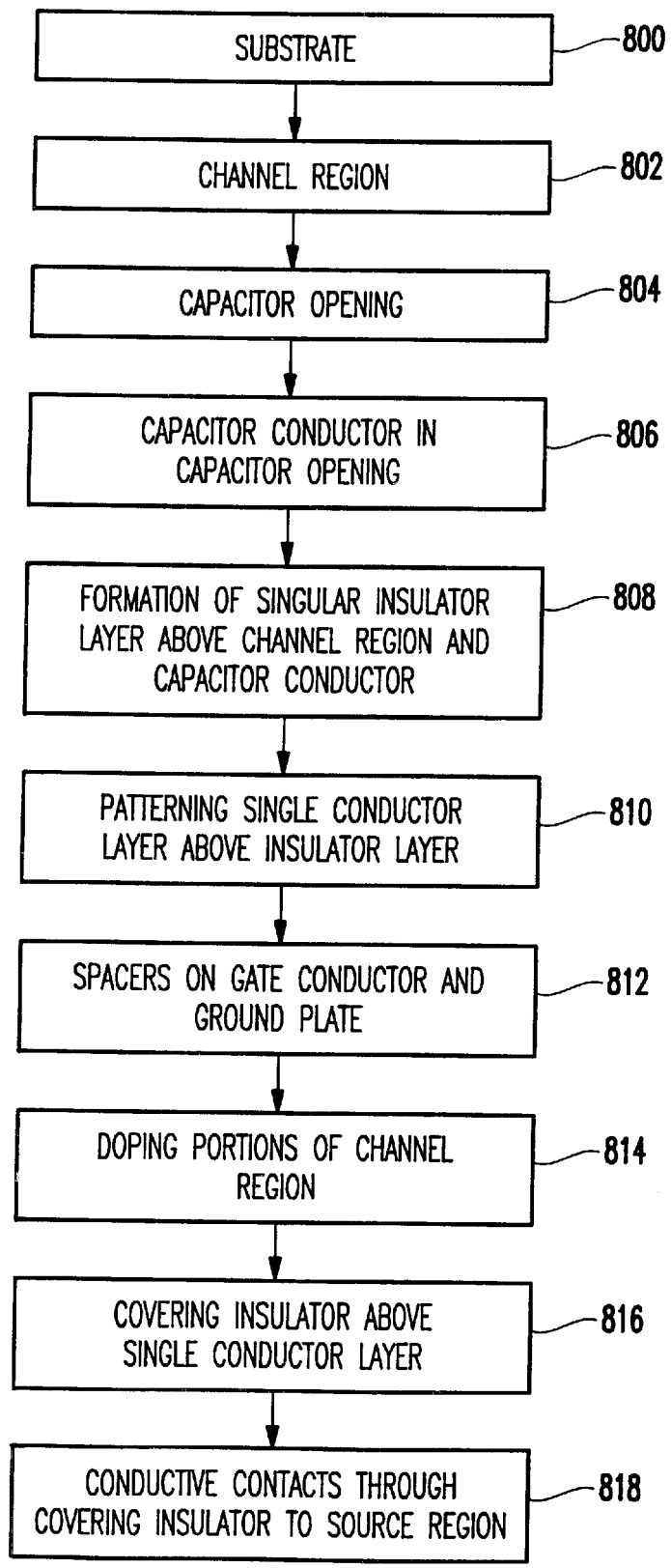
FIG. 15 is a flow diagram illustrating a preferred method of the invention.

The inventive process is shown in flowchart form in FIG. 15. More specifically, in item 152 the invention forms channel regions 802 and capacitor openings 804 in a substrate 800. Next the invention deposits capacitor conductors 806 in the capacitor openings 804. Then, the invention simultaneously forms a single high-k dielectric insulator layer 808 above the channel regions 802 and the capacitor conductor 806. This single insulator layer comprises a capacitor node dielectric above the capacitor conductor 806 and comprises a gate dielectric above the channel region.

In addition the invention simultaneously patterns a single conductor layer 810 above the single insulator layer 808. The single conductor layer 810 forms a gate conductor above the gate dielectric and a ground plate above the capacitor node dielectric. In additional processing steps, the invention forms spacers on the gate conductor and the ground plate, dopes portions of the channel region 814 to form source and drain regions (the drain region is in contact with the capacitor conductor), forms a covering insulator above the single conductor layer, and forms conductive contacts 818 through the covering insulator to the source region.

As shown above, the invention reduces the number of process steps to form DRAMs. More specifically, the invention forms the gate dielectric 31 and the capacitor dielectric 31 in a single step. To the contrary, conventional stack capacitors (especially those using high-k dielectric) are usually formed after the gate formation and source/drain implantations. Thus, conventionally, a thick layer of insulating material is deposited and planarized. Then, a contact hole to the drain region of the device is formed. However, for this conventional structure, a complicated contact stub formation is needed. For example an oxygen diffusion barrier layer must be formed inside or on top of the contacts to avoid oxygen diffusion while annealing the high-k material in the oxygen ambient. Then, another thick insulation material must be deposited and a hole etched in the insulator to form a support region of the stack capacitor component. Next, a special metal must be deposited and patterned. Finally, with the conventional structure, a high-k dielectric and a ground metal is deposited and annealed at high temperature in an O2 ambient. This complicated processing is avoided with the invention.

Further, with the invention since the capacitor of each cell is coplanar to the devices, the DRAM array will have a very planar surface. To the contrary, with conventional structure, the capacitors are formed above the gate of the transfer device by about 200 nm to 1000 nm.

One more advantage of the invention is that the annealing step takes place at a much earlier stage than any of the conventional stack capacitor process. The annealing in oxygen could damage the source/drain silicide layer if it takes place after silicide formation. The invention anneals the film before the source/drain implant and silicide formation. Therefore, unlike conventional art, the annealing of the invention will have no detrimental effect on the devices.

In addition, the gate dielectric 31 of the device as well as the dielectric 31 of the cell capacitor, and other on-chip capacitor, such as decoupling capacitor, reservoir capacitors are made with a high-k material. More specifically, the high-k dielectric material 31 will remain amorphous up to (and slightly beyond) 1000° C. This amorphous high-k dielectric prevents the dielectric 31 from crystalizing and reduces the possibility of excessive leakage along the resultant grain boundaries. The characteristic of the high-k dielectric material is much more stable than those of the conventional high-k material. No oxygen diffusion barrier nor adhesion promoter layer is needed. This (e)DRAM has a great potential to be further scaled and operated at low-power with a reasonably high-performance.

Also, the device performance will be much better than the conventional devices with the same power supply and device size because the capacitor formed with the invention will have more surface area resulting in better charge storage capacity than those of the conventional capacitor with the low-k dielectric.

While the invention has been described in terms of preferred embodiments, those skilled in the art will recognize that the invention can be practiced with modification within the spirit and scope of the appended claims.

What is claimed is:

1. A dynamic random access memory device comprising:
   a substrate;
   at least one channel region in said substrate;
   at least one capacitor conductor in said substrate;
   a single planar insulator layer above said channel region and above said capacitor conductor, wherein said single planar insulator layer comprises an upper capacitor node dielectric above said capacitor conductor and comprises a gate dielectric above said channel region; and
   a lower capacitor node dielectric below said capacitor conductor.

2. The device in claim 1, further comprising a single conductor layer above said single planar insulator layer, wherein said single conductor layer comprises a gate conductor above said gate dielectric and a ground plate above said upper capacitor node dielectric.

3. The device in claim 2, further comprising spacers on said gate conductor and said ground plate.

4. The device in claim 2, further comprising source and drain regions within said substrate, wherein said drain region is in contact with said capacitor conductor and said source region is positioned on an opposite side of said gate conductor from said drain region.

5. The device in claim 4, further comprising:
   a covering insulator above said single conductor layer; and
   conductive contacts extending through said covering insulator to said source region.

6. The device in claim 1, wherein said substrate includes shallow trench isolation regions below said capacitor conductor.

7. The device in claim 1, wherein said single planar insulator layer has molar ratios consistent with glass and maintains an amorphous state up to 1000° C.

8. The device in claim 1, wherein said single planar insulator layer is a high-k dielectric material including $La_xO_y$, $Al_xO_y$, $Hf_xO_y$ with a dielectric constant in the range of 10 to 50.

9. A dynamic random access memory device comprising:
   a substrate;
   at least one channel region in said substrate;
   at least one capacitor conductor in said substrate;
   a single planar insulator layer above said channel region and above said capacitor conductor, wherein said single planar insulator layer comprises an upper capacitor node dielectric above said capacitor conductor and comprises a gate dielectric above said channel region;
   a lower capacitor node dielectric below said capacitor conductor;
   a single conductor layer above said single planar insulator layer, wherein said single conductor layer comprises a gate conductor above said gate dielectric and a ground plate above said upper capacitor node dielectric;
   spacers on said gate conductor and said ground plate;
   source and drain regions within said substrate, wherein said drain region is in contact with said capacitor conductor and said source region is positioned on an opposite side of said gate conductor from said drain region;
   a covering insulator above said single conductor layer; and
   conductive contacts extending through said covering insulator to said source region.

10. A dynamic random access memory device comprising:
    a substrate;
    at least one channel region in said substrate;
    at least one capacitor conductor in said substrate;
    a single insulator layer above said channel region and above said capacitor conductor, wherein said single insulator layer comprises a capacitor node dielectric above said capacitor conductor and comprises a gate dielectric above said channel region;
    a single conductor layer above said single insulator layer, wherein said single conductor layer comprises a gate conductor above said gate dielectric and a ground plate above said capacitor node dielectric;
    spacers on said gate conductor and said ground plate;
    source and drain regions within said substrate, wherein said drain region is in contact with said capacitor conductor and said source region is positioned on an opposite side of said gate conductor from said drain region;
    a covering insulator above said single conductor layer; and
    conductive contacts extending through said covering insulator to said source region,
    wherein said insulating substrate includes shallow trench isolation regions below said capacitor conductors.

11. The device in claim 9, wherein said single planar insulator layer has molar ratios consistent with glass and maintains an amorphous state up to 1000° C.

12. A method of producing a dynamic random access memory device, said method comprising:
    forming a capacitor opening in a substrate;
    forming a lower capacitor node dielectric in said capacitor opening;
    forming a capacitor conductor in said capacitor opening;
    simultaneously forming a single planar insulator layer above a channel region of said substrate and above said capacitor conductor, wherein said single planar insulator layer comprises an upper capacitor node dielectric above said capacitor conductor and comprises a gate dielectric above said channel region.

13. The method in claim 12, further comprising simultaneously patterning a single conductor layer above said single plan insulator layer, wherein said single conductor layer comprises a gate conductor above said gate dielectric and a ground plate above said upper capacitor node dielectric.

14. The method in claim 13, further comprising:

forming spacers on said gate conductor and said ground plate; and doping portions of said channel region to form source and drain regions, wherein said drain region is in contact with said capacitor conductor.

15. The method in claim 14, further comprising:

forming a covering insulator above said single conductor layer; and forming conductive contacts through said covering insulator to said source region.

16. The method in claim 12, wherein said substrate includes shallow trench isolation regions below said capacitor conductors.

17. The method in claim 12, further comprising, before forming said capacitor opening, forming said channel region comprising a process of forming a pure silicon region within said substrate.

18. The method in claim 12, wherein said forming of said single planar insulator layer comprises an atomic level chemical vapor deposition process having molar ratios consistent with glass.

19. A method of simultaneously producing a dynamic random access memory device and associated transistor, said method comprising:

providing a substrate;

forming a channel region in said substrate;

forming a capacitor opening in said substrate;

forming a lower capacitor node dielectric in said capacitor opening;

forming a capacitor conductor in said capacitor opening;

a simultaneously forming a single planar insulator layer above said channel region and above said capacitor conductor, wherein said single planar insulator layer comprises an upper capacitor node dielectric above said capacitor conductor and comprises a gate dielectric above said channel region;

simultaneously patterning a single conductor layer above said single planar insulator layer, wherein said single conductor layer comprises a gate conductor above said gate dielectric and a ground plate above said upper capacitor node dielectric;

forming spacers on said gate conductor and said ground plate;

doping portions of said channel region to form source and drain regions, wherein said drain region is in contact with said capacitor conductor;

forming a covering insulator above said single conductor layer; and forming conductive contacts through said covering insulator to said source region.

20. A method of simultaneously producing a dynamic random access memory device and associated transistor, said method comprising;

providing a substrate;

forming a channel region in said substrate;

forming a capacitor opening in said substrate;

forming a capacitor conductor in said capacitor opening;

simultaneously forming a single insulator layer above said channel region and above said capacitor conductor, wherein said single insulator layer comprises a capacitor node dielectric above said capacitor conductor and comprises a gate dielectric above said channel region;

simultaneously patterning a single conductor layer above said single insulator layer, wherein said single conductor layer comprises a gate conductor above said gate dielectric and a ground plate above said capacitor node dielectric;

for spacers on said gate conductor and said ground plate;

doping portions of said channel region to form source and drain regions, wherein said drain region is in contact with said capacitor conductor;

forming a covering insulator above said single conductor layer; and forming conductive contacts through said covering insulator to said source region, wherein said insulating substrate includes shallow trench isolation regions below said capacitor conductors.

21. The method in claim 19, wherein said forming of said channel region comprises forming a pure silicon region within said substrate.

22. The method in claim 19, wherein said forming of said single plan insulator layer comprises an atomic level chemical vapor deposition process having molar ratios consistent with glass.

* * * * *